United States Patent [19]
Aoshima et al.

[11] Patent Number: 5,153,667
[45] Date of Patent: Oct. 6, 1992

[54] APPARATUS FOR DETECTING THE CHANGE OF LIGHT INTENSITY

[75] Inventors: Shinichiro Aoshima; Hironori Takahashi; Yutaka Tsuchiya, all of Shizuoka, Japan

[73] Assignee: Hamamatsu Photonics K. K., Shizuoka, Japan

[21] Appl. No.: 617,615

[22] Filed: Nov. 26, 1990

[30] Foreign Application Priority Data

Nov. 30, 1989 [JP] Japan .................................. 1-311249

[51] Int. Cl.$^5$ ............................................. G01J 1/42
[52] U.S. Cl. .................................... 356/218; 356/222; 356/368; 359/255
[58] Field of Search ............... 356/213, 215, 218, 221, 356/222, 336, 226, 229, 394, 432, 433, 434, 435, 364-370; 250/232, 233, 205; 350/355, 374, 384, 385, 393; 324/96, 77 K; 359/247, 255, 257

[56] References Cited

U.S. PATENT DOCUMENTS

| | | | |
|---|---|---|---|
| 3,675,022 | 7/1972 | Nelson et al. | 359/255 |
| 3,994,590 | 11/1976 | Di Martini et al. | 356/434 |
| 4,171,909 | 10/1979 | Kramer et al. | 356/435 |
| 4,446,425 | 5/1984 | Valdamanis et al. | 350/385 |
| 4,531,092 | 7/1985 | Shibano . | |
| 4,632,518 | 12/1986 | Jensen | 359/247 |
| 4,691,106 | 9/1987 | Hyun et al. | 356/447 |
| 4,855,591 | 8/1989 | Nakamura et al. | 359/247 |
| 4,890,925 | 1/1990 | Kitamori et al. | 356/336 |

FOREIGN PATENT DOCUMENTS

| | | |
|---|---|---|
| 021199 | 1/1981 | European Pat. Off. . |
| 046298 | 2/1982 | European Pat. Off. . |
| 63-300969 | 12/1988 | Japan . |
| 64-9370 | 1/1989 | Japan . |

OTHER PUBLICATIONS

A. Smith "Noise Reduction" Proc. IEEE, vol. 125, No. 10, Oct. 1978, p. 935—p. 941; FIG. 8.
EP-A-0021199 Shibaura Abstract, p. 4, line 8; p. 7, line 18; FIG. 1.
Janis A. Valdmanis et al., "Subpicosecond Electrooptic Sampling: Principles and Applications," IEEE Journal of Quantum Electronics, vol. QE-22, No. 1, Jan. 1986 pp. 69-78.

Primary Examiner—Richard A. Rosenberger
Assistant Examiner—Hoa Pham
Attorney, Agent, or Firm—Finnegan, Henderson, Farabow, Garrett and Dunner

[57] ABSTRACT

A light beam is chopped and split into two beams. Intensity of a first beam is changed by using, e.g., an electrooptic material in accordance of a change in a signal to be detected, such as a voltage in an electronic device, and detected by a first photodetector. On the other hand, a second beam is detected by a second photodetector without being subjected to the intensity change. At least one of the outputs of the first and second photodetectors are adjusted so that they become equal to each other when no signal is applied to the light intensity changing means. The difference of the thus adjusted output signals is detected by, e.g., a lock-in amplifier in a narrow band at the chopping frequency.

16 Claims, 6 Drawing Sheets

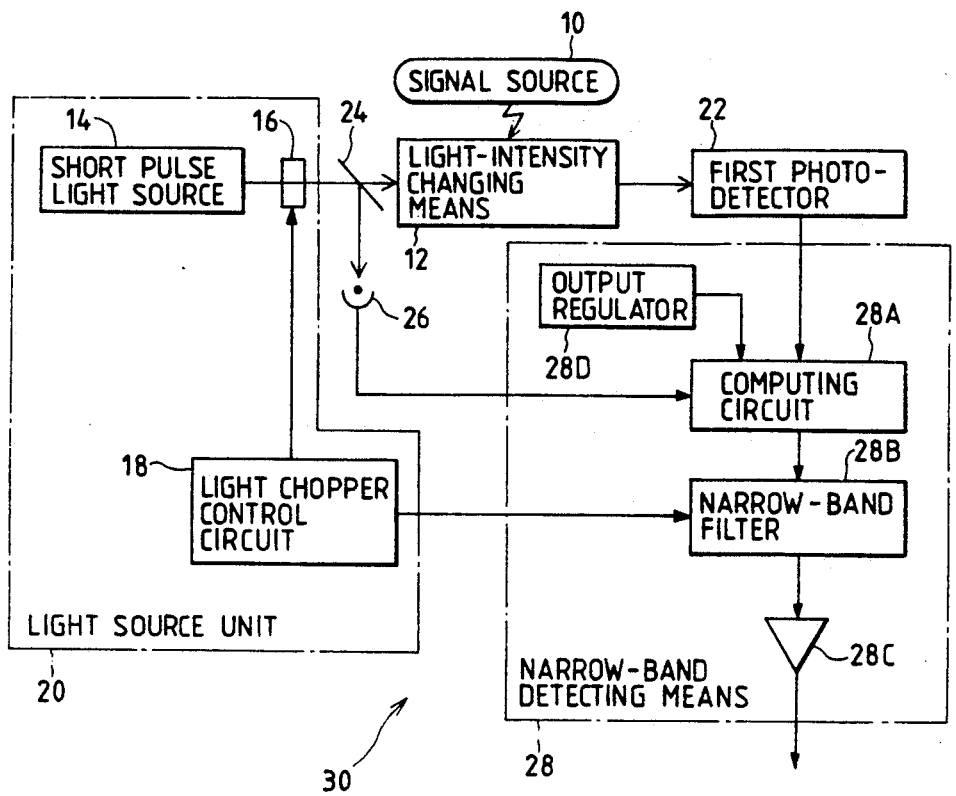
FIG. 1
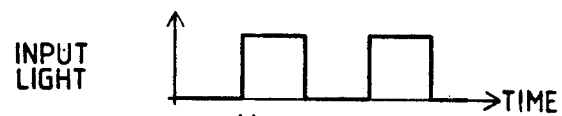
FIG. 3(A) INPUT LIGHT
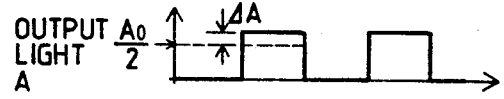
FIG. 3(B) OUTPUT LIGHT A
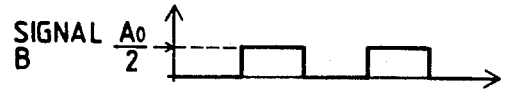
FIG. 3(C) SIGNAL B
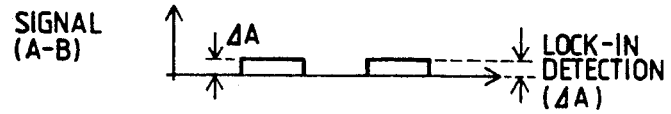
FIG. 3(D) SIGNAL (A-B)

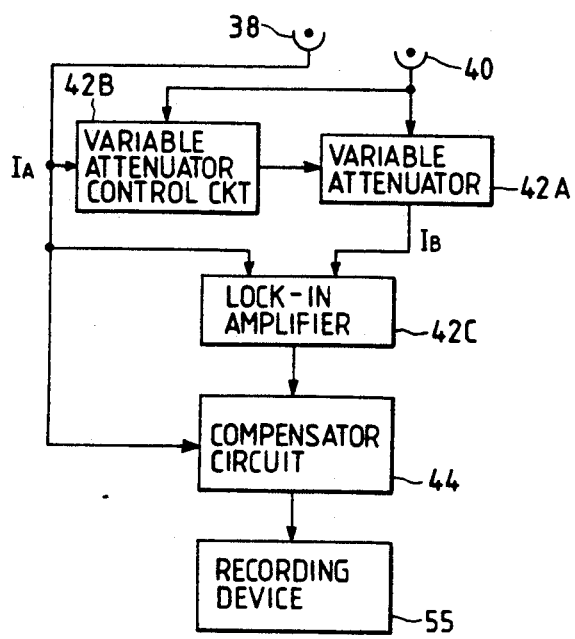
FIG. 4
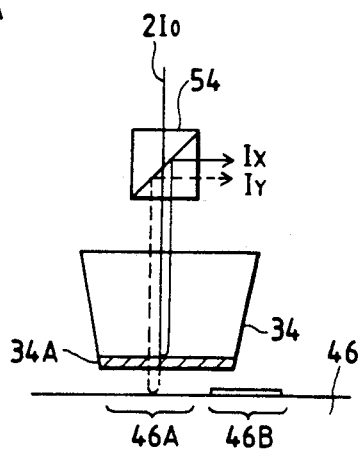
FIG. 5
FIG. 6(A)
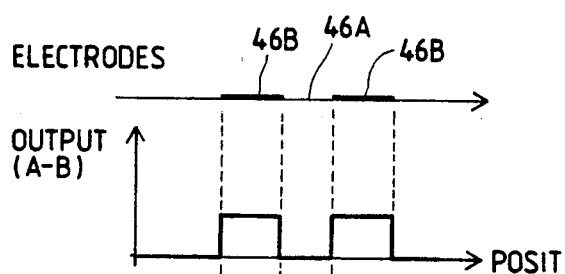
FIG. 6(B) NO VOLTAGE APPLIED, $I_{A-B(X)}$
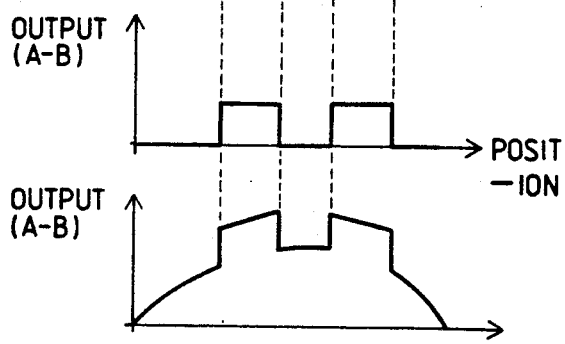
FIG. 6(C) VOLTAGE APPLIED, $I_{A-B(0)}$
FIG. 6(D) $I_{A-B(0)} - I_{A-B(X)}$
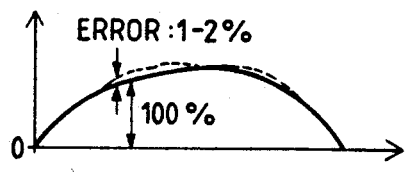

FIG. 13
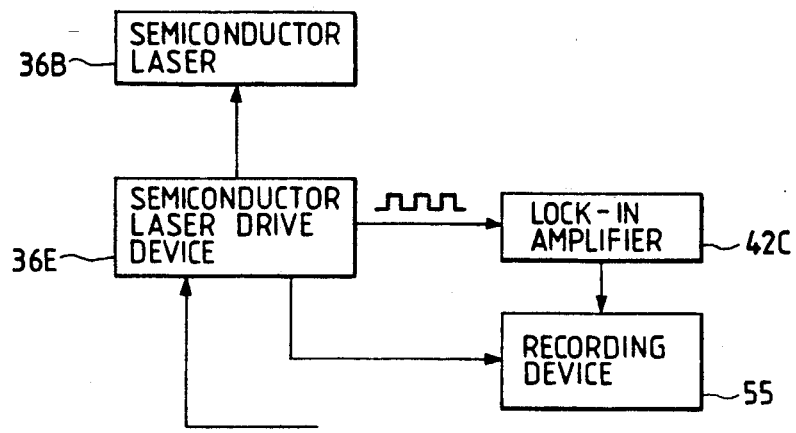
FIG. 14(A) (PRIOR ART) INPUT LIGHT
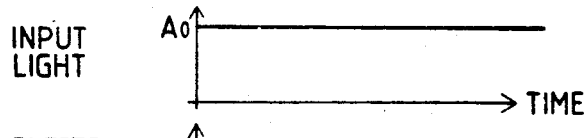
FIG. 14(B) (PRIOR ART) ELECTRIC SIGNAL
FIG. 14(C) (PRIOR ART) OUTPUT LIGHT
FIG. 15(A) (PRIOR ART) INPUT LIGHT
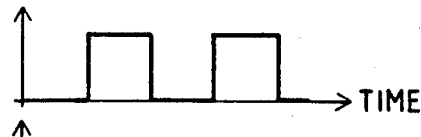
FIG. 15(B) (PRIOR ART) ELECTRIC SIGNAL
FIG. 15(C) (PRIOR ART) OUTPUT LIGHT
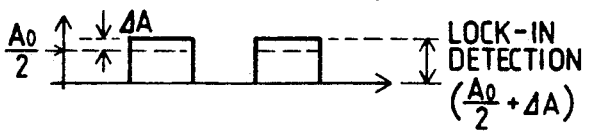

APPARATUS FOR DETECTING THE CHANGE OF LIGHT INTENSITY

BACKGROUND OF THE INVENTION

This invention relates to an apparatus for detecting the change of light intensity. More particularly, it relates to an apparatus for detecting the change of light intensity that is equipped with a light intensity changing means such as an electrooptic crystal that allows the intensity of incident light to vary in accordance with the change in a signal to be measured such as an electric field.

An example of the apparatus for detecting the change of light intensity is an electrooptic (E/O) voltage detector which uses an electrooptic material whose refractive index is changed by the strength of an applied electric field. Conventional versions of this E/O voltage detector are disclosed in U.S. Pat. No. 4,446,425, Japanese Patent Application Unexamined Publication Nos. 300969/1988, 9370/1989, etc.

These voltage detectors have an optical probe that is made of an electrooptic material having a light-reflecting surface on its tip. The light reflected from said reflecting surface is received by a photodetector and subjected to photoelectric conversion. However, the dynamic range of the photodetector is not wide enough to allow a small change in light intensity (voltage change) to be detected with high S/N ratio. To overcome this difficulty, it has been necessary that the electric signal to be measured be turned on and off, and the signal of such a modulation frequency be amplified over a narrow band.

In the inventions described in the prior patents listed above, this need can be easily met if the electric signal to be measured is an output signal from a photodetector, since one only need to turn the incident pulse light on and off. However, the problem is that the device that can be measured (i.e., the source of the electric signal to be measured) is limited to one that generates an electric signal in response to input light.

As an alternative, the electric signal to be measured may be directly turned on and off by means of an electric chopper, but, in this case, the waveform of a signal to be measured will be distorted when it passes through the electric chopper, whereby it becomes difficult to achieve correct waveform measurements.

Considering the measurement of a dc voltage, the intensity of light passing through an E/O probe will change if a voltage is applied to it, so that the measurement of the dc voltage should be made possible by monitoring the quantity of transmitted light with a photodetector. In fact, however, the E/O probe has such a low sensitivity that if the applied voltage is only a few volts, the resulting change in the quantity of light is too small to be detected by an optical power meter having an ordinary dynamic range.

It has generally been proposed that an electric signal of interest be chopped as shown in FIG. 14, with only the modulated component being efficiently detected with a lock-in amplifier. This technique, however, is not effective when a dc voltage is to be measured, since the dc electric signal cannot be chopped. Instead, the input light to the optical probe may be chopped as shown in FIG. 15. However, if the output light is simply subjected to lock-in detection, it is the light intensity itself that is measured as shown in FIG. 15(C), and the change in light intensity resulting from the application of a voltage to the E/O probe cannot be detected.

Further, the light-reflecting surface is formed at the tip of the optical probe and it is practically impossible to achieve 100% reflection by this surface. This inevitably causes part of the incident light to leak toward a source of the signal to be measured. If part of the incident light leaks toward the signal source, the light reflected from the latter will be transmitted again through the light-reflecting surface to enter the optical probe, and detected as part of the output signal. If, even in this case, the reflectance of the signal source is constant, correct measurements can be accomplished by processing the output signal in consideration of said constant reflectance and the transmittance of the light-reflecting surface. However, if the signal source is, for example, an LSI, its reflectance will change in accordance with its circuit pattern and this cannot be easily compensated.

SUMMARY OF THE INVENTION

The present invention has been accomplished under these circumstances of the prior art and the principal object of this invention is to provide an apparatus for detecting the change of light intensity which is capable of correctly detecting the change of the signal to be measured without turning it on or off.

Another object of the present invention is to provide an apparatus for detecting the change of light intensity that is also capable of measuring an unchanging signal such as a dc voltage.

A further object of the present invention is to provide an apparatus for detecting the change of light intensity that has a light intensity changing means with a light-reflecting surface and which is capable of compensating for the noise caused by the light transmitted through the reflecting surface.

Yet another object of the present invention is to provide an apparatus for detecting the change of light intensity that is capable of compensating for the noise variation that is caused by the light transmitted through the reflecting surface and the variation in the reflectance of the surface of a signal source.

These objects of the present invention can be attained by an apparatus for detecting a signal through a change of light intensity which comprises:
light source means including:
a light source for emitting a light beam;
light chopping means for chopping the light beam at a predetermined chopping frequency; and
chopping control means for controlling the light chopping means in synchronism with the signal to be detected;
light intensity changing means for changing an intensity of part of the light beam from the light source means in accordance with a change in the signal being applied thereto;
first photodetecting means for converting an output light beam of the light intensity changing means into a first electrical signal;
second photodetecting means for converting part of the light beam which is emitted from the light source means and not subjected to the light intensity changing by the light intensity changing means into a second electrical signal; and
narrow-band detecting means for detecting a difference between the first and second electrical signals in a narrow band at the chopping frequency.

In the present invention, the light to be incident on the light intensity changing means, rather than the signal to be measured, is turned on and off by means of the light chopping means, so that compared to the case where the signal to be measured is chopped, the waveform of said signal can be measured in a desired correct way. The present invention also enables the measurement of an unchanging signal such as a dc voltage.

BRIEF DESCRIPTION OF THE DRAWINGS

FIG. 1 is a block diagram showing an apparatus for detecting the change of light intensity according to a first embodiment of the present invention;

FIGS. 3(A-D) are a diagram illustrating the operation of the apparatus according to the second embodiment;

FIG. 4 is a block diagram showing the essential part of an apparatus for detecting the change of light intensity according to a third embodiment of the present invention;

FIG. 5 is an enlarged cross-sectional view of an optical probe used in the third embodiment and the nearby area;

FIGS. 6(A-D) are a diagram showing the results of measurement in accordance with the third embodiment;

FIGS. 7-13 are block diagrams showing modifications of various parts of the apparatus according to the second embodiment;

FIGS. 14(A-C) are a diagram showing the result of detection with a prior art voltage detector when an electric signal to be measured is chopped; and FIGS. 15(A-C) are a diagram showing the result of detection with another prior art voltage detector when input light is chopped.

DETAILED DESCRIPTION OF THE PREFERRED EMBODIMENTS

Figure 2:
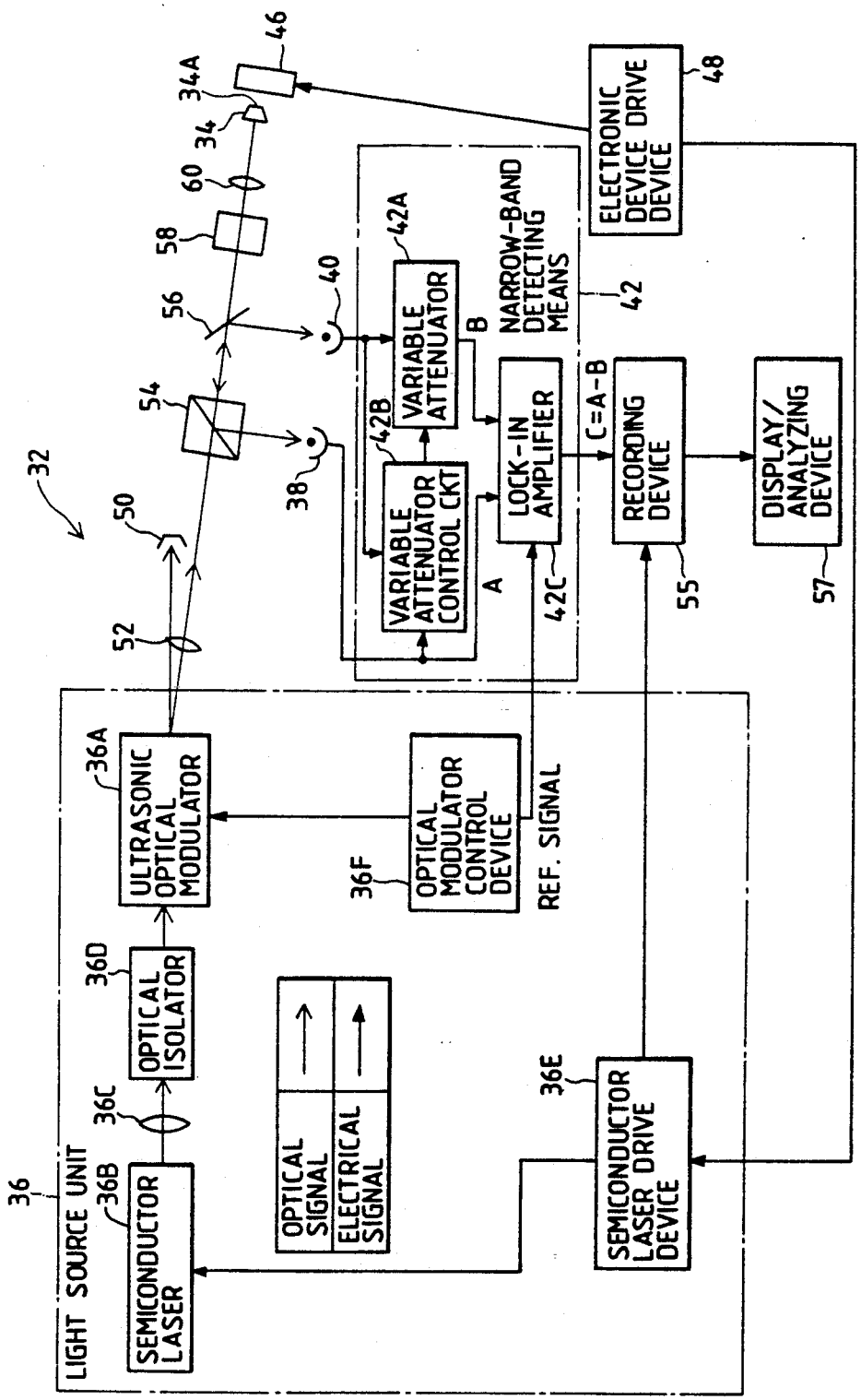
FIG. 2 is a block diagram showing an apparatus for detecting the change of light intensity according to a second embodiment of the present invention.

Various embodiments of the present invention are described below with reference to FIGS. 1-13.

As shown in FIG. 1, an apparatus for detecting the change of light intensity according to a first embodiment of the present invention is generally indicated by numeral 30 and comprises the following components: a light-intensity changing means 12 such as an electrooptic device, a Faraday rotation device, an accoustooptic device or a certain type of fiber optics that allow the intensity of incident light to vary in accordance with the change of a signal to be measured from a signal source 10 such as an electric signal source that produces a change in voltage, an ultrasonic signal source that is accompanied by a change in intensity or frequency, or a similar optical magnetic signal source.

Thus, the light intensity changing means 12 effectively converts variations in a parameter represented by an input signal into light intensity variations which make it possible to measure the parameter variations in accordance with the present invention. A light source unit 20 including a short pulse light source 14 composed of a semiconductor laser, light chopper 16 that allows the light emitted from said short pulse light source 14 to be repeatedly turned on and off at high speed, and light chopper control circuit 18 that controls said light chopper 16 in synchronism with said signal source 10; a first photodetector 22 that performs photoelectric conversion on the component of light that is emitted from said light source unit 20 and transmitted through said light intensity changing means 12; a beam splitter 24 for separating part of the light from said light source unit 20 to be deflected sidewise before the light intensity changing means 12; a second photodetector 26 that receives the thus separated light component and performs photoelectric conversion on it; and a narrow-band detecting means 28 that calculates the difference between the outputs of said first and second photodetectors 22 and 26 and which performs narrow-band detection on the calculated difference at the on/off frequency of said light chopper 16.

The narrow-band detecting means 28 is composed of a computing circuit 28A that calculates the difference between the outputs of said first and second photodetectors 22 and 26, a narrow-band filter 28B that detects the output signal from the computing circuit 28A in a narrow band at the on/off frequency of said light chopper 16, an amplifier 28C for amplifying the output of this narrow-band filter 28B, and an output regulator 28D that adjusts said computing circuit 28A in such a way that the difference between the outputs of the first and second photodetectors 22 and 26 will be zero in the absence of any change in light intensity that will occur in the light intensity changing means 12 on account of the signal to be measured. This output regulator 28D adjusts either the output of the first photodetector 22 or the output of the second photodetector 26, or both of those.

In the first embodiment of the present invention described above, the signal from the signal source 10 is not directly turned on or off but the incident light is turned on and off by the light chopper 16, and yet the result is the same as what would be attained by turning the signal of interest on and off. Accordingly, this embodiment offers the advantage that the signal waveform distortion which would otherwise occur if the signal to be measured were turned on and off, whereby the waveform of that signal can be measured correctly.

If the short pulse light source 14 is operated in synchronism with the signal to be measured, the change in light intensity that occur in the light intensity changing means 12 on account of the change in the signal to be measured can be detected with a gating time that is comparable to the duration of each light pulse emitted from the short pulse light source 14. In this case, neither of the first and second photodetectors 22 and 26 need to have high-speed responding characteristics.

In the first embodiment described above, a short pulse light source is used, but this may be replaced by a cw light source if there is no need to detect the signal of interest with a short gating time.

The second photodetector 26 used in the first embodiment receives part of the incident light as separated by the beam splitter 24 before it is input to the light intensity changing means 12. However, it suffices that this second photodetector is capable of receiving light the intensity of which has not yet been changed by the light-intensity changing means 12. Thus, a beam splitter may be provided on the exit side of the light-intensity changing means 12 so that the second photodetector receives the component of the output light that has not been changed in intensity on account of the signal to be measured.

In the first embodiment, the light chopper 16 is a mechanical light chopper, an ultrasonic optical modulator or a light source drive circuit.

Further, the narrow-band filter used in the narrow-band detecting means 28 may be replaced by a spectrum analyzer, a lock-in amplifier or a narrow-bandpass amplifier.

FIG. 2 is a block diagram showing schematically an apparatus for detecting the change of light intensity according to a second embodiment of the present invention, in which said apparatus is used as a voltage detector which is generally indicated by numeral 32. As shown, the voltage detector 32 comprises an optical probe 34 that is made of an electrooptic material whose refractive index varies in accordance with an electric field developing in a selected part of an object to be measured and which has a light reflecting surface 34A formed at the tip, a light source unit 36 for generating a light beam to be input to said optical probe 34, and a first photodetector 38 that performs photoelectric conversion on a light beam that is emitted from the light source unit 36, then launched into the optical probe 34, reflected by the light-reflecting surface 34A, and finally output from the optical probe 34. The voltage detector 32 is adapted to measure the voltage of the object of interest on the basis of the change in the output of the first photodetector 38. According to the second embodiment of the present invention, the light source unit 36 is equipped with an ultrasonic optical modulator 36A that repeatedly turns on and off the light beam. The voltage detector 32 further includes a second photodetector 40 that performs photoelectric conversion on the light beam component that has not been influenced by the change in refractive index by the electric field on the optical probe 34 and which is received before said optical probe 34, and a narrow-band detecting means 42 that detects the difference between the outputs of the first and second photodetectors 38 and 40 in a narrow band at the on/off frequency of the ultrasonic optical modulator 36A.

The light source unit 36 is composed of the ultrasonic optical modulator 36A, a semiconductor laser 36B as a light source, a condenser lens 36C and an optical isolator provided between the semi-conductor laser 36B and the ultrasonic optical modulator 36A, a semiconductor laser drive device 36E for driving the semiconductor laser 36B in synchronism with an electronic device 46 which is the object to be measured, and an optical modulator control device 36F for controlling the ultrasonic optical modulator 36A.

Shown by numeral 48 is an electronic device control device for driving the electronic device 46, which is adapted to supply the semiconductor laser drive device 36E with a signal for achieving synchronization with the electronic device 46.

The ultrasonic optical modulator 36A which is controlled by the optical modulator control device 36F is designed s that zeroth-order (non-modulated) light the optical probe 34 but travels toward a light stopper 50, and that when the light is modulated by ultrasonic waves, the first-order light passes through a collimator lens 52 to travel toward the optical probe 34.

Between the collimator lens 52 and the optical probe 34 are provided a polarizing beam splitter 54, a beam splitter 56, a compensator 58 and a condenser lens 60 in the order written. The light that has passed through these components to be input to the optical probe 34 and which is thereafter reflected by the light-reflecting surface 34A is separated by the polarizing beam splitter 54 to be deflected sidewise and input to the first photodetector 38. On the other hand, the beam the splitter 56 separates part of the first-order light before the optical probe 34, and deflects it sidewise to be directed to the second photodetector 40. As in the case of the first embodiment, it suffices that the second photodetector 40 is capable of receiving light the intensity of which has not yet been changed by the electric field applied to the optical probe 34. Therefore, the beam splitter 56 may be disposed so as to deflect sidewise part of the light beam reflected from the optical probe 34 to introduce it to the second photodetector 40. This is because the intensity change of the reflected light beam from the optical probe 34, which is due to the applied electric field, can be produced by passing it through a polarizing element such as the polarizing beam splitter 54, but a mere beam splitter does not produce such a light intensity change.

The narrow-band detecting means 42 is composed of a variable attenuator 42A for adjusting the output signal of the second photodetector 40, a variable attenuator control circuit 42B that controls this variable attenuator 42A in response to the outputs of the first and second photodetectors 38 and 40 so that the outputs of the first photodetector 38 and the variable attenuator 42A become equal to each other in the absence of any electric field applied to said optical probe 34, and a lock-in amplifier 42C that amplifies the difference between the output from said first photodetector 38 and the output from the variable attenuator 42A in a narrow band at the on/off frequency of the ultrasonic optical modulator 36A on the basis of a reference signal from said optical modulator control circuit 36F.

Shown by numeral 55 in FIG. 2 is a recording unit that records the output from said narrow band detecting means 42 together with the amount of change in the timing of the light pulse generation in the semiconductor laser 36B on the basis of a signal from said semiconductor laser drive device 36E. Shown by numeral 57 is a device for displaying and analyzing recording data in the recording device 55.

The operation of the apparatus according to the second embodiment is described below.

The electronic device 46 to be measured is driven by the electronic device drive device 48. Based on the signal from this electronic device drive device 48, the semiconductor laser drive device 36E drives the semiconductor laser 36B in synchronism with the electronic device 46.

The light issuing from the semiconductor laser 36B is input to the ultrasonic optical modulator 36A via the condenser lens 36C and the optical isolator 36D. The ultrasonic optical modulator 36A is driven by the optical modulator control device 36F and the first-order light produced by modulating the incident light is incident on the optical probe 34 via the collimator lens 52, polarizing beam splitter 54, beam splitter 56, compensator 58 and condenser lens 60.

An electric field created by the voltage on the electronic device 46 acts on the optical probe 34 and the polarization state of light is changed in said optical probe 34 in accordance with this electric field. The light input to the optical probe 34 is reflected by the light-reflecting surface 34A and thence passes through the condenser lens 60, compensator 58 and beam splitter 56 to arrive at the polarizing beam splitter 54, by which it is reflected toward the first photodetector 38.

The first-order light from the ultrasonic optical modulator 36A passes through the beam splitter 56 but part of it is reflected to arrive at the second photodetector 40.

The output A of the first photodetector 38 is supplied to the lock-in amplifier 42C. The output B of the second photodetector 40 (i.e., the output of the variable attenuator 42A) is automatically and preliminarily adjusted by means of the variable attenuator 42A and the variable attenuator control circuit 42B so that B becomes equal to A in the absence of any electric field applied to the optical probe 34. After adjustment by the variable attenuator 42A, the output B is also supplied to the lock-in amplifier 42C. Based on the reference signal from the optical modulator control device 36F, the component of the signal A−B which corresponds to the on/off modulation frequency of the ultrasonic optical modulator 36A is amplified in a narrow band by the lock-in amplifier 42C.

The signal A−B=C which is the output from the lock-in amplifier 42C is supplied to the recording unit 55, which records this output of the lock-in amplifier 42C together with the amount of change in the timing of the light pulse generation in the semiconductor laser drive device 36E, and the recording data is displayed and analyzed by the device 57.

Thus, in the second embodiment of the present invention, the signal in the electronic device 46 to be measured is not turned on and off, but instead the light to be input to the optical probe 34 is turned on and off by the ultrasonic optical modulator 36A and the result is the same as what would be attained if the very signal to be measured were turned on and off. In addition, the distortion of the signal waveform that would otherwise occur if the signal were turned on and off in the electronic device 46 can be avoided.

In this second embodiment, the semiconductor laser 36B is driven in synchronism with the signal of the electronic device 46, so that by changing the timing of successive generation of light pulses, the waveform of the signal in the electronic device 46 can be correctly measured.

As described above, the second embodiment of the present invention enables the measurement of rapidly changing electric waveforms by synchronizing the semiconductor laser 36B with the operation of the electronic device 46. It should, however, be noted that the present invention is in no way limited to this particular case alone and that it is also applicable to the case where a dc voltage is applied to the electronic device 46. In this case, the light source in the light source unit need not be a pulse light source and may be a cw light source such as a He-Ne laser.

Measurements of dc voltages have been impossible in the prior art as shown in FIGS. 14 and 15. However, in accordance with the second embodiment of the present invention, the input light is chopped as shown in FIG. 3 and only the change in output light due to the application of a voltage to the optical probe 34 can be detected by the lock-in detection of the differential signal (A−B) in the lock-in amplifier 42C, as shown in FIG. 3(D). Thus, even an absolute voltage can be measured in accordance with the second embodiment of the present invention.

FIG. 4 is a block diagram showing schematically an apparatus for detecting the change of light intensity in accordance with a third embodiment of the present invention. This third embodiment differs from the already described second embodiment in that a compensator circuit 44 is provided on the output side of the lock-in amplifier 42C. The other components of the third embodiment are the same as those used in the second embodiment, so like parts are identified by like numerals and will not be described in detail.

The compensator circuit 44 performs the following two functions: first, it computes the difference between the output of the lock-in amplifier 42C for the case where no electric field is applied to the optical probe 34 and the output for the case where an electric field is applied; second, it divides, by a divider, the computed difference by the output that is produced from the first photodetector 38 when no electric field is applied to the optical probe 34.

The operation of the apparatus according to the third embodiment of the present invention is described below.

It is generally impossible to achieve 100% reflection by the light-reflecting surface 34A at the tip of the optical probe 34. Hence, part of the light input to the optical probe 34 passes through the reflecting surface 34A to arrive at the surface of the object to be measured and is thence reflected by said surface to make another entry into the optical probe via the reflecting surface 34A. This reentry light is detected by the photodetector as noise to cause an error in measurement. Further, if there is any variation in the reflectance of the surface of the object to be measured, the error component due to the light reflected from said surface also varies with the change in its reflectance, whereby it becomes more difficult to achieve correct measurements.

The compensator circuit 44 is intended to enable correct measurements by eliminating not only the error caused by the light transmitted through the light-reflecting surface 34A because of such imperfection in its reflectance, but also the error due to the variation in the reflectance of the surface of the object to be measured.

As shown in FIG. 5, suppose that the surface of the object to be measured, say, the electronic device 46, has two areas 46A and 46B having different reflectances $R_1$ and $R_2$, respectively. Also suppose that the incident light has an intensity of $2I_0$ and that the light-reflecting surface 34A has a reflectance of $R_0$.

If $R_0 = 1$, the fundamental output I of the optical probe 34 is expressed by:

$$I = I_0 \{1 + (\pi/V_\pi)v\} \quad (1)$$

where $V_\pi$ is the half-wave voltage and v is a voltage to be measured.

If $R_0 < 1$, the output $I_x$ of light reflected by the reflecting surface 34A and the output $I_y$ of light transmitted through said surface are respectively expressed by:

$$I_x = R_0 I_0 \{1 + (\pi/V_\pi)v\} \quad (2)$$

$$I_y = (1 - R_0)^2 R_1 I_0 \{1 + (\pi/V_\pi)v\} \quad (3).$$

Since I expressed by equation (1) is nearly equal to the sum of $I_x$ and $I_y$, equation (1) can be rewritten as:

$$\begin{aligned} I &= I_x + I_y \\ &= I_0 \{1 + (\pi/V_\pi)v\}\{R_0 + (1 - R_0)^2 R_1\} \end{aligned} \quad (4)$$

where Ix and Iy are each supposed to be decreased by half by means of the polarizing beam splitter 54.

As already mentioned in connection with the second embodiment, the narrow-band detecting means 42 includes the variable attenuator 42A and the variable attenuator control circuit 42B and is pre-adjusted in such a way that the outputs of the first and second photodetectors 38 and 40 become equal to each other in the absence of any electric field applied to the optical probe 34. In this pre-adjusted state, the lock-in amplifier 42C produces a differential output $I_A - I_B$, or $A - B = C$ as shown in FIG. 2.

When the first area 46A and the second area 46B are measured, $I_A$, $I_B$ and $I_{A-B}$ for the respective areas may be expressed as follows depending on whether a voltage is applied to the optical probe 34.

As for the first area 46A, they can be expressed by equations (5)-(9), where (o) denotes the presence of a voltage applied and (x) denotes the absence of voltage application:

$$I_A(x) = I_0\{R_0 + (1 - R_0)^2 R_1\} \quad (5)$$

$$I_A(o) = I_0\{R_0 + (1 - R_0)^2 R_1\}\{1 + (\pi/V_\pi)v\} \quad (6)$$

$$I_B = I_A(x) = I_0\{R_0 + (1 - R_0)^2 R_1\} \quad (7)$$

$$I_{A-B}(x) = I_A(x) - I_B = 0 \quad (8)$$

$$I_{A-B}(o) = I_A(o) - I_B = I_0\{R_0 + (1 - R_0)^2 R_1\}(\pi/V_\pi)v \quad (9)$$

As for the second area 46B, $I_A$, $I_B$ and $I_{A-B}$ can be expressed by equations (10)-(13):

$$I_A(x) = I_0\{R_0 + (1 - R_0)^2 R_2\} \quad (10)$$

$$I_A(o) = I_0\{R_0 + (1 - R_0)^2 R_2\}\{1 + (\pi/V_\pi)v\} \quad (11)$$

$$I_{A-B}(x) = I_A(x) - I_B = I_0(1 - R_0)^2(R_2 - R_1) \quad (12)$$

$$I_{A-B}(o) = I_A(o) - I_B = I_0[(1 - R_0)^2(R_2 - R_1) + \{R_0 + (1 - R_0)^2 R_2\}(\pi/V_\pi)v] \quad (13)$$

$I_B$ is expressed by equation (7).

The difference between the differential output $(A - B)$ in the presence of a voltage applied to the optical probe 34 and the differential output $(A - B)$ in the absence of an applied voltage may be expressed as follows for the area 46A:

$$I_{A-B}(o) - I_{A-B}(x) = I_0\{R_0 + (1 - R_0)^2 R_1\}(\pi/V_\pi)v. \quad (14)$$

For the area 46B, $$I_{A-B}(o) - I_{A-B}(x) = I_0\{R_0 + (1 - R_0)^2 R_2\}(\pi/V_\pi)v. \quad (15)$$

Since $R_1$ in equation (14) differs from $R_2$ in equation (15), it cannot be said that the outputs are completely compensated (see FIG. 6).

If equations (14) and (15) are each divided by the output $I_A(x)$ in the absence of voltage change, the following equation (16) is derived for each case, and the difference in the differential output $(A - B)$ is not dependent on the reflectance R1 of the first area 46A and the reflectance R2 of the second area 46B but is proportional to the applied voltage v:

$$\{I_{A-B}(o) - I_{A-B}(x)\}/I_A(x) = (\pi/V_\pi)v \quad (16)$$

As already mentioned, the compensator circuit 44 divides the differential output from the lock-in amplifier 42C by the output of the first photodetector 38 for the case where no voltage is applied to the optical probe 34, and this eventually provides equation (16).

Suppose here that the light-reflecting surface 34A has a reflectance $(R_0)$ of 90% and that, in the worse case of the electronic device 46, the first area 46A has a reflectance $(R_1)$ of 0% and the second area 46B has a reflectance $(R_2)$ of 100%. Then, $R_0 + (1-R_0)^2 R_1 = R_0 = 0.90$ in the area 46A and $R_0 + (1-R_0)^2 R_2 = R_0 + (1-R_0) = 0.91$ in the area 46B. In other words, the output compensated by equations (14) and (15) differs by about 1% from the output compensated by equation (16). Hence, the precision of measurement that is attained in accordance with the third embodiment is about 1%.

In the third embodiment described above, the variable attenuator 42A is pre-adjusted in such a way that $I_{A-B}(x)$ becomes zero for the first area 46A. It is noted that the same pre-adjustment may be performed for the second area 46B instead of the first area 46A.

Figure 7:
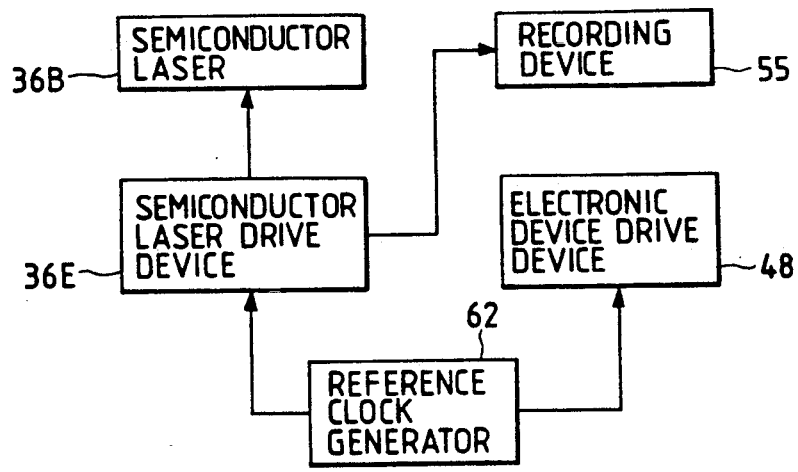

In the second and third embodiments described above, the semiconductor laser drive device 36E is driven on the basis of the signal from the electronic device drive device 48. If desired, a reference clock generator 62 may be provide which, as shown in FIG. 7, supplies a clock signal to both the semiconductor laser drive device 36E and the electronic device drive device 48.

Figure 8:
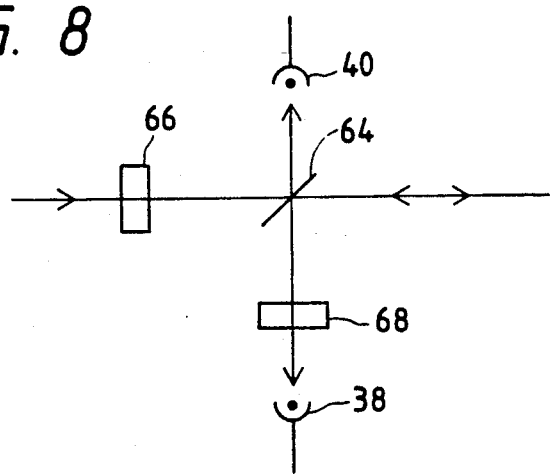
Figure 9:
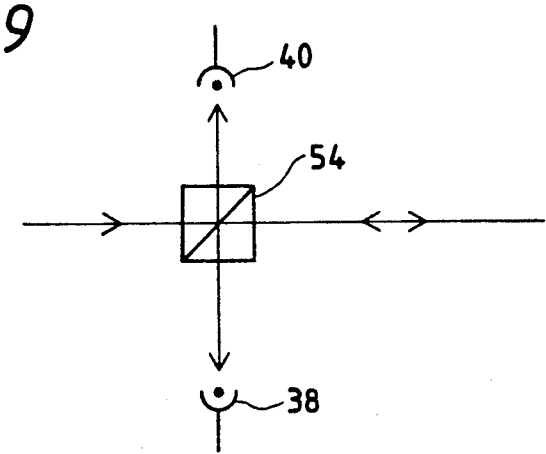
Figure 10:
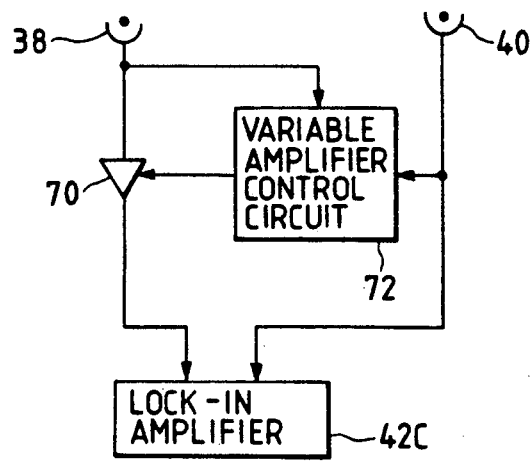

In the second and third embodiments, the first photodetector 38 and the second photodetector 40 receive light beams that are reflected by the polarizing beam splitter 54 and the beam splitter 56, respectively. If desired, a half mirror 64 may be provided on the optical axis of the incident light as shown in FIG. 8 so that part of the incident light passing through a polarizer 66 is reflected to the second photodetector 40 and part of the return light from the optical probe 34 is input to the first photodetector 38 via an analyzer 68. Alternatively, the half mirror 64 may be replaced by the polarizing beam splitter 54 as shown in FIG. 9.

In the second and third embodiments, the output of the second photodetector 40 is controlled by means of the variable attenuator 42A and the variable attenuator control circuit 42B in such a way that it becomes equal to the output of the first photodetector 38 when no voltage is applied to the optical probe 34. If desired, the same result can be attained by the circuit configuration shown in FIG. 10 which includes a variable amplifier 70 for amplifying the output of the first photodetector 38 and a variable amplifier control circuit 72 that controls said variable amplifier 70 in accordance with the outputs of the first and second photodetectors 38 and 40.

Figure 11:
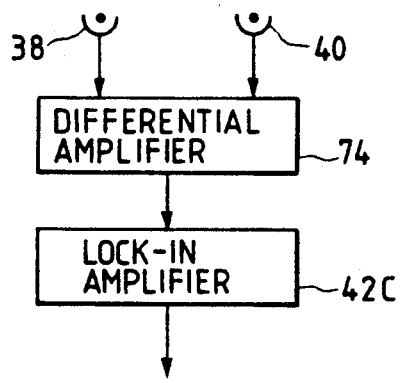

Alternatively, the outputs of the first and second photodetectors 38 and 40 may be supplied to a differential amplifier 74 as shown in FIG. 11, with its output being supplied to the lock-in amplifier 42C. In this case, the differential amplifier 74 should be preadjusted in such a way that the output signals of the first and second photodetectors 38 and 40 will become equal to each other when no voltage is applied to the optical probe 34.

Figure 12:
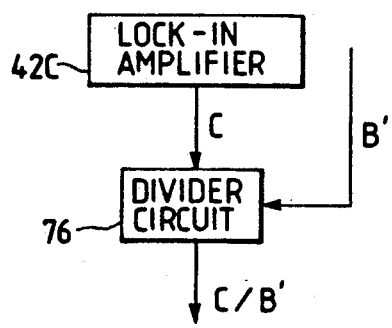

Further, a divider circuit 76 may be provided on the output side of the lock-in amplifier 42C as shown in FIG. 12. The divider circuit 76 divides the differential output of the lock-in amplifier 42C by part of the output from the second photodetector 40, so that any operational variation in the light source unit 36 can be canceled out.

In the embodiments described above, the emitted light is turned on and off by means of the ultrasonic optical modulator 36A or the light chopper 16. If desired, for example, the semiconductor laser 36B may be electrically turned on and off by the semiconductor laser drive device 36E so as to produce the same result as is attained by turning on and off the light by the optical modulator 36A. In this case, the on/off signal in the semiconductor laser drive device 36E may be used as a reference signal for the lock-in amplifier 42C as shown in FIG. 13.

Having the construction described above, the apparatus of the present invention is adapted to turn the incident light on and off and yet it produces results comparable to those which would be attained by directly turning on and off the signal to be measured. Further, the apparatus has the advantage of preventing the occurrence of waveform distortion in the signal to be measured.

What is claimed is:

1. An apparatus for detecting an input signal representing a predetermined parameter, through a change of light intensity, said apparatus comprising:
   light source means including:
   a light source for emitting a light beam;
   light chopping means for chopping the light beam at a predetermined chopping frequency; and
   chopping control means for controlling the light chopping means in synchronism with the signal to be detected;
   light intensity changing means for changing the intensity of a first part of the light beam from the light source means;
   means for applying the input signal to be detected as an input to the light intensity changing means;
   said light intensity changing means changing the intensity of the light beam first part in accordance with changes in the input signal;
   first photodetecting means for converting an output light beam of the light intensity changing means into a first electrical signal representative of the input signal to be detected;
   second photodetecting means for converting another part of the light beam which is emitted from the light source means and not subjected to the light intensity changing by the light intensity changing means into a second electrical signal; and
   narrow-band detecting means for detecting a first difference between the first and second electrical signals in a narrow band at the chopping frequency to indicate the change in the input signal and its represented parameter.

2. The apparatus according to claim 1, wherein the second photodetecting means receives the part of the light beam before its incidence on the light intensity changing means.

3. The apparatus according to claim 1, further comprising means for adjusting at least one of the first and second electrical signals so that the first difference between the first and second electrical signals becomes substantially zero when the signal to be detected is not applied to the light intensity changing means.

4. The apparatus according to claim 1, wherein the light source emits short light pulses in synchronism with the signal to be detected.

5. The apparatus according to claim 1, wherein the chopping means comprises a mechanical light chopper.

6. The apparatus according to claim 1, wherein the chopping means comprises an ultrasonic optical modulator.

7. The apparatus according to claim 1, wherein the chopping means comprises a light source drive circuit for controlling the light source so as to turn on and off the light source at the chopping frequency.

8. The apparatus according to claim 1, wherein the narrow-band detecting means comprises a spectrum analyzer.

9. The apparatus according to claim 1, wherein the narrow-band detecting means comprises a narrow-band filter.

10. The apparatus according to claim 1, wherein the narrow-band detecting means comprises a lock-in amplifier.

11. The apparatus according to claim 1, wherein the narrow-band detecting means comprises a narrow-bandpass amplifier.

12. The apparatus according to claim 1, wherein the light source is a semiconductor laser.

13. The apparatus according to claim 1, wherein the input signal to be detected is a voltage developing in an object, and wherein the light intensity changing means comprises an electrooptic material whose refractive index is changed in accordance with a change in the voltage via an electric field created by the voltage.

14. The apparatus according to claim 13, wherein the light intensity changing means comprises a probe including the electrooptic material, whereby the apparatus can detect the voltage in a non-contact manner.

15. The apparatus according to claim 13, wherein the light source is a pulsed laser, whereby the apparatus can detect a waveform of the voltage with high time resolution.

16. The apparatus according to claim 1, further comprising compensating means for computing a second difference between outputs of the narrow-band detecting means which are obtained with and without application of the signal to be detected to the light intensity changing means, and for dividing the second difference by the first electrical signal obtained without application of the signal to the light intensity changing means.

* * * * *

UNITED STATES PATENT AND TRADEMARK OFFICE
CERTIFICATE OF CORRECTION

PATENT NO.    :   5,153,667
DATED         :   October 06, 1992
INVENTOR(S)   :   Shinichiro Aoshima et al.

It is certified that error appears in the above-identified patent and that said Letters Patent is hereby corrected as shown below:

Abstract, title page, line 10, change "are" to --is--.

Abstract, title page, line 10, change "they become" to --they becomes--.

Claim 1, columns 11, Line 39, change "light beam first part" to --first part of the light beam--.

Signed and Sealed this

Twenty-eighth Day of December, 1993

Attest:

BRUCE LEHMAN

*Attesting Officer*      *Commissioner of Patents and Trademarks*